United States Patent
Fukasaku

(10) Patent No.: US 9,711,497 B2
(45) Date of Patent: Jul. 18, 2017

(54) SEMICONDUCTOR UNIT WITH PROECTION CIRCUIT AND ELECTRONIC APPARATUS

(71) Applicant: Sony Corporation, Tokyo (JP)

(72) Inventor: Katsuhiko Fukasaku, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/271,805

(22) Filed: May 7, 2014

(65) Prior Publication Data

US 2014/0339644 A1    Nov. 20, 2014

(30) Foreign Application Priority Data

May 17, 2013 (JP) .................................. 2013-105288

(51) Int. Cl.
*H01L 27/02* (2006.01)

(52) U.S. Cl.
CPC ........ *H01L 27/0248* (2013.01); *H01L 27/027* (2013.01)

(58) Field of Classification Search
CPC .............. H01L 27/0248; H01L 27/027; H01L 27/0274; H01L 27/0277

USPC ........................................................ 257/380
See application file for complete search history.

(56) References Cited

U.S. PATENT DOCUMENTS

| | | | | |
|---|---|---|---|---|
| 5,784,241 | A | * | 7/1998 | Munch ................. H03G 3/32 361/111 |
| 6,919,602 | B2 | * | 7/2005 | Lin et al. .................. 257/360 |
| 2001/0038128 | A1 | * | 11/2001 | Woolery et al. ............ 257/363 |
| 2002/0066929 | A1 | * | 6/2002 | Voldman .................... 257/355 |
| 2010/0244128 | A1 | * | 9/2010 | Bulucea ......... H01L 21/26513 257/335 |
| 2011/0062553 | A1 | * | 3/2011 | Stache et al. .............. 257/536 |
| 2012/0168869 | A1 | * | 7/2012 | Hikida ....................... 257/365 |
| 2014/0015053 | A1 | * | 1/2014 | Di Sarro et al. ........... 257/350 |
| 2014/0139957 | A1 | * | 5/2014 | Stockinger ...... H01L 27/0629 361/56 |

FOREIGN PATENT DOCUMENTS

| JP | 2004-014929 | 1/2004 |
|---|---|---|
| JP | 2006-121007 | 5/2006 |

* cited by examiner

*Primary Examiner* — Kevin Parendo
(74) *Attorney, Agent, or Firm* — DENTONS US LLP

(57) ABSTRACT

A semiconductor unit includes: a transistor configured to provide electrical conduction between a first terminal and a second terminal, based on a trigger signal; and a trigger device formed in a transistor region where the transistor is formed, and configured to generate the trigger signal, based on a voltage applied to the first terminal.

17 Claims, 9 Drawing Sheets

SEMICONDUCTOR UNIT WITH PROECTION CIRCUIT AND ELECTRONIC APPARATUS

CROSS REFERENCE TO RELATED APPLICATIONS

This application claims the benefit of Japanese Priority Patent Application JP 2013-105288 filed May 17, 2013, the entire contents which are incorporated herein by reference.

BACKGROUND

The present disclosure relates to a semiconductor unit and an electronic apparatus each including a protective circuit that is configured to protect an internal circuit from damage caused by electrostatic discharge (ESD).

A typical semiconductor unit includes a protective circuit to protect an internal circuit from damage caused by electrostatic discharge. For example, Japanese Unexamined Patent Application Publication Nos. 2006-121007 and 2004-14929 disclose protection circuits each including a trigger circuit in which a predetermined time constant is set, an inverter, and an N-type MOS (Metal Oxide Semiconductor) transistor. The trigger circuit in Japanese Unexamined Patent Application Publication No. 2006-121007 is configured by connecting a resistor device and a capacitor device in series to each other between a power supply terminal and a ground terminal, and the trigger circuit in Japanese Unexamined Patent Application Publication No. 2004-14929 is configured by connecting a P-type MOS transistor and a capacitor device in series to each other between a power supply terminal and a ground terminal. In each of these protection circuits, the trigger circuit generates a trigger signal by rounding a waveform of a voltage signal caused by static electricity applied to the power supply terminal. Then, the inverter inverts the trigger signal, and the N-type MOS transistor changes from an OFF state to an ON state, based on the inverted trigger signal. Thus, the protection circuit discharges static electricity applied to the power supply terminal to a ground through the N-type MOS transistor.

Moreover, various techniques for transistors having high tolerance to static electricity have been disclosed. For example, Japanese Unexamined Patent Application Publication No. H2-271673 discloses a transistor achieving an improvement in tolerance to static electricity by providing regions that are not silicided between a gate and a source and between the gate and a drain.

SUMMARY

It is desirable to be able to reduce a layout area of a circuit integrated in a semiconductor unit, and further downsizing is expected.

It is desirable to provide a semiconductor unit and an electronic apparatus each of which includes a protection circuit capable of reducing its layout area.

According to an embodiment of the present disclosure, there is provided a semiconductor unit including a transistor and a trigger device. The transistor is configured to provide electrical conduction between a first terminal and a second terminal, based on a trigger signal. The trigger device is formed in a transistor region where the transistor is formed, and is configured to generate the trigger signal, based on a voltage applied to the first terminal.

According to an embodiment of the present disclosure, there is provided an electronic apparatus including: a transistor; a trigger device; and an internal circuit. The transistor is configured to provide electrical conduction between a first terminal and a second terminal, based on a trigger signal. The trigger device is formed in a transistor region where the transistor is formed, and is configured to generate the trigger signal, based on a voltage applied to the first terminal. The internal circuit is connected to the first terminal and the second terminal.

In the semiconductor unit and the electronic apparatus according to the embodiments of the present disclosure, the trigger device generates the trigger signal, based on the voltage applied to the first terminal, and the transistor is turned on or off, based on the trigger signal. The trigger device is formed in the transistor region.

In the semiconductor unit and the electronic apparatus according to the embodiments of the present disclosure, the trigger device is formed in the transistor region; therefore, a layout area is allowed to be reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the technology, and are incorporated in and constitute a part of this specification. The drawings illustrate embodiments and, together with the specification, serve to explain the principles of the technology.

DETAILED DESCRIPTION

Some embodiments of the present disclosure will be described detail below referring to the accompanying drawings. It is to be noted that description will be given in the following order.
1. Embodiment
2. Application Examples

1. Embodiment

Configuration Example

Figure 1:
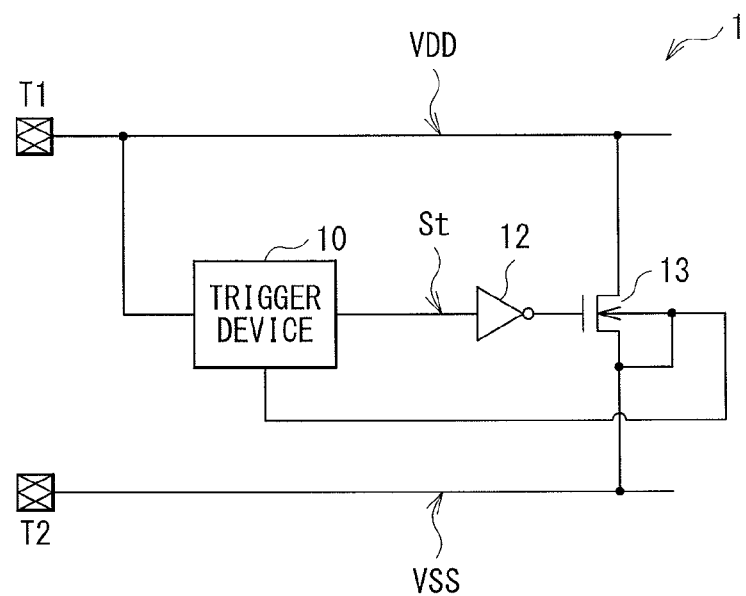
FIG. 1 is a block diagram illustrating a configuration example of a protection circuit according to an embodiment of the present disclosure.

FIG. 1 illustrates a configuration example of a protection circuit according to an embodiment. A protection circuit 1 is configured to discharge static electricity applied to a power supply terminal T1 to a ground terminal T2. The protection circuit 1 includes a trigger device 10, an inverter 12, and a transistor 13.

The trigger device 10 is configured to generate a trigger signal St, based on a signal applied to the power supply terminal T1. As will be described later, the trigger device 10 is configured on a surface of a semiconductor substrate 100P in a region where the transistor 13 is formed. The trigger device 10 generates the trigger signal St by rounding a waveform of a voltage signal of the power supply terminal T1 by a predetermined time constant τ. The time constant τ may be set, based on, for example, ESD testing standards such as HBM (Human Body Model) and CDM (Charged Device Model). The HBM simulates electrostatic discharge from a charged human body, and the time constant τ may be set to, for example, about 1 [usec]. Moreover, the CDM simulates discharge from a device charged itself, and the time constant τ may be set to, for example, about 1 [nsec]. In the protection circuit 1, at normal power-on, a power supply voltage is slowly changed by the time constant τ; therefore, the trigger signal St virtually follows a voltage (power supply voltage) of the power supply terminal T1. In this case, the transistor 13 operates so as to maintain an OFF state. On the other hand, in a case where static electricity is applied to the power supply terminal T1, the voltage of the power supply terminal T1 is abruptly changed; therefore, the trigger signal St does not follow the voltage of the power supply terminal T1. In this case, the transistor 13 is transiently turned to an ON state to discharge the static electricity from the power supply to a ground.

Figure 2:
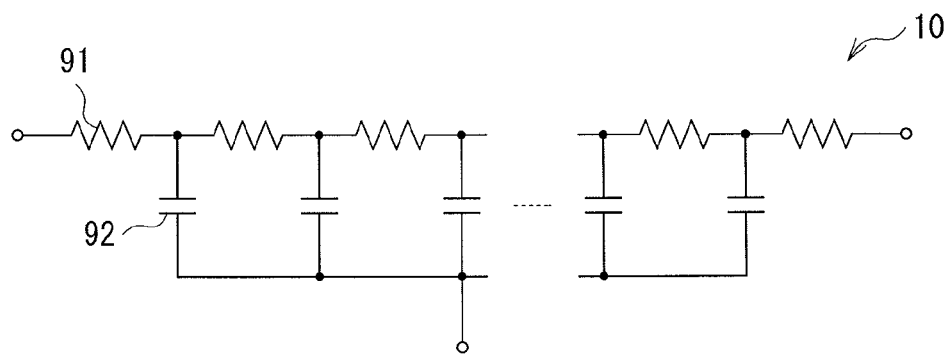
FIG. 2 is a circuit diagram illustrating an equivalent circuit of a trigger device illustrated in FIG. 1.

FIG. 2 illustrates an equivalent circuit of the trigger device 10. As will be described later, the trigger device 10 is configured by laminating an insulating layer 141, a resistive layer 142, and the like on the semiconductor substrate 100P, and may be represented by a distributed parameter circuit configured of a resistive component of the resistive layer 141 and a capacitive component of the insulating layer 141. In this diagram, the distributed parameter circuit is represented by a ladder model configured of a plurality of resistor devices 91 and a plurality of capacitor devices 92. More specifically, the plurality of resistor devices 91 are connected in series to one another, and a tap of each resistor device 91 is connected to a first end of each capacitor device 92. Second ends of the plurality of capacitor devices 92 are connected to one another. As will be described later, the second ends of the capacitor devices 92 correspond to the semiconductor substrate 100P. A voltage VSS is applied to the semiconductor substrate 100P. Such a configuration allows the trigger device 10 to function as a low-pass filter with the time constant τ.

The inverter 12 is a circuit that inverts the logic of an input signal, and then outputs the logic-inverted signal. An input terminal of the inverter 12 is connected to an output terminal of the trigger device 10, and an output terminal of the inverter 12 is connected to a gate of the transistor 13. The inverter 12 is configured of an odd number of stages (for example, three stages) of inverter circuits, and each of the inverter circuits is configured to perform a logic operation between a voltage VDD and a voltage VSS.

The transistor 13 is an N-type MOS transistor, and a drain, a gate, and a source of the transistor 13 are connected to the power supply terminal T1, the output terminal of the inverter 12, and the ground terminal T2, respectively.

Figure 3:
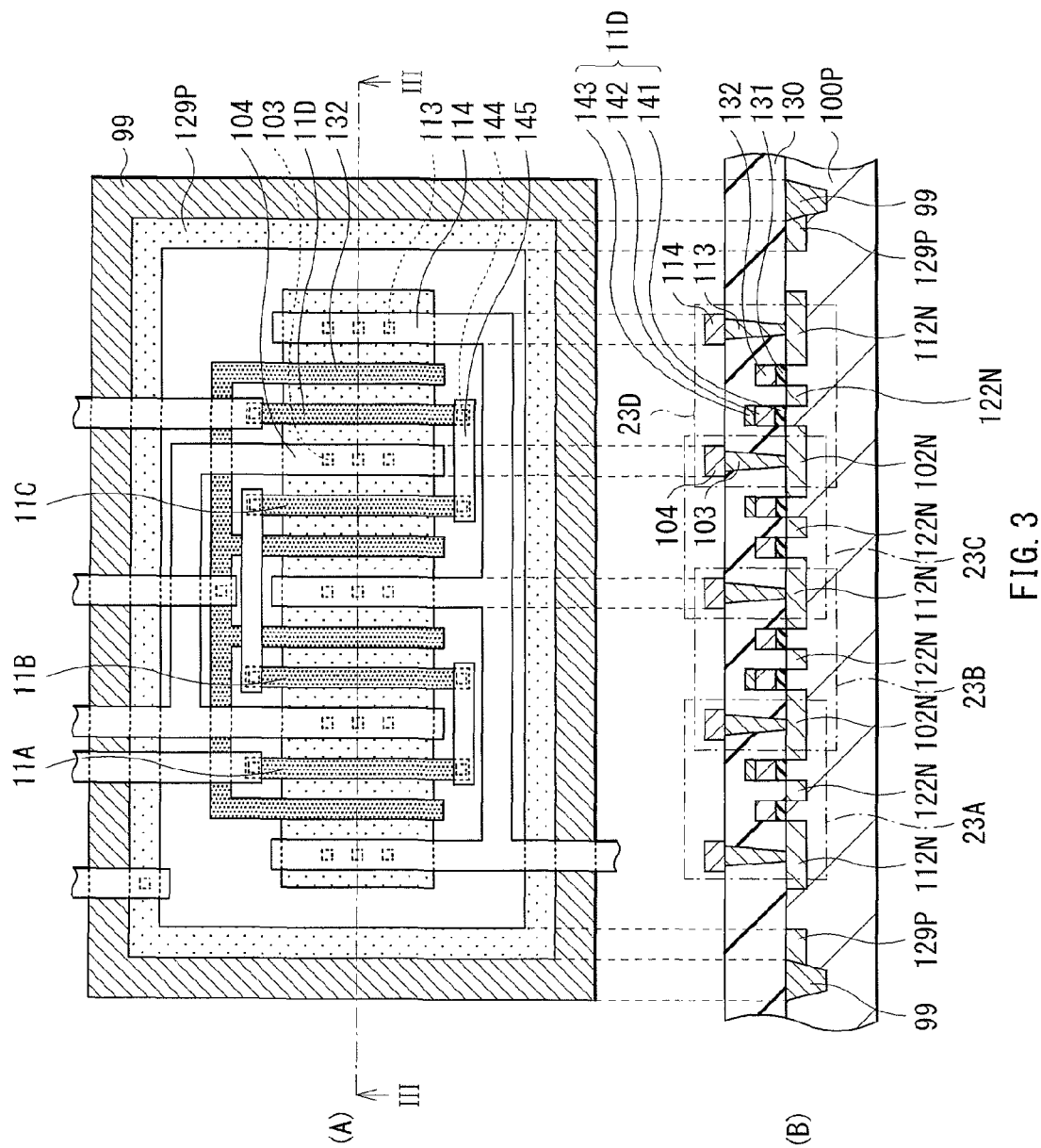
FIG. 3 is a plan view and a sectional view illustrating a layout of a transistor and the trigger device illustrated in FIG. 1.

FIG. 3 illustrates an example of a layout of the transistor 13 and the trigger device 10, and parts (A) and (B) in FIG. 3 illustrate a plan view and a sectional view taken along a line III-III in an arrow direction, respectively. The transistor 13 and the trigger device 10 are formed on the P-type semiconductor substrate 100P with use of a typical process of manufacturing a CMOS (Complementary Metal Oxide Semiconductor). As illustrated in the part (A) in FIG. 3, a device isolation section 99 is formed in a ring shape in a surface of the semiconductor substrate 100P, and the transistor 13 and the trigger device 10 are formed in a region (a transistor region RTR) enclosed by the device isolation section 99. In this example, the transistor 13 is divided into four transistor elements 23A to 23D, and the transistor elements 23A to 23D are laid out so as to share a drain or a source by adjacent two of the transistor elements 23A to 23D. Moreover, in this example, the trigger device 10 is divided into four trigger elements 11A to 11D, and is configured of a series connection of the trigger elements 11A to 11D. As used herein, the term "transistor element 23" is used as any one of the transistor elements 23A to 23D as necessary. Likewise, the term "trigger element 11" is used as any one of the trigger elements 11A to 11D as necessary.

The transistor 13 includes semiconductor layers 102N, 112N, and 122N, an insulating layer 131, and a conductive layer 132. The semiconductor layers 102N, 112N, and 122N are N-type semiconductor layers disposed in the surface of the semiconductor substrate 100P. The voltage VSS is supplied from an external device to the semiconductor substrate 100P through a semiconductor layer 129P formed in a ring shape. The semiconductor layer 102N and the semiconductor layer 122N are formed at a predetermined distance from each other, and semiconductor layer 122N and the semiconductor layer 112N are formed at a predetermined distance from each other. The semiconductor layer 102N corresponds to a drain of the transistor 13, and the semiconductor layer 112N corresponds to a source of the transistor 13. The insulating layer 131 is formed on the semiconductor substrate 100P in a region between the semiconductor layer 112N and the semiconductor layer 122N. The insulating layer 131 may be made of, for example, a silicon oxide ($SiO_2$). A conductive layer 132 is formed on the insulating layer 131. The conductive layer 132 corresponds to a gate of the transistor 13. The conductive layer 132 may be made of polysilicon that is silicided with use of cobalt (Co), nickel (Ni), or the like. The conductive layer 132 also functions as a mask layer used to form the semiconductor layer 112N and the semiconductor layer 122N separately from each other in a manufacturing process. The conductive layers 132 (gates) of the transistor elements 23A to 23D are connected to one another, and are connected to an output terminal of the inverter 12 (not illustrated) through a wiring line.

Each of the trigger elements 11A to 11D includes an insulating layer 141, a resistive layer 142, and a block layer 143. The insulating layer 141 is formed on the semiconductor substrate 100P in a region between the semiconductor layer 102N (drain) and the semiconductor layer 122N. As with the insulating layer 131, the insulating layer 141 may be made of, for example, silicon oxide. The resistive layer 142 is formed on the insulating layer 141. The resistive layer 142 may be made of, for example, polysilicon that is not silicided. In other words, unlike the conductive layer 132, the resistive layer 142 achieves a high resistance value by not being silicided. The block layer 143 is formed on the resistive layer 142. The block layer 143 may be configured of, for example, a nitride film. The block layer 143 has a function of blocking the resistive layer 142 from being silicided when the conductive layer 132 is silicided in a manufacturing process. Moreover, the block layer 143 also has a function as a mask layer used to form the semiconductor layer 102N and the semiconductor layer 122N separately from each other. The resistive layers 142 of the trigger elements 11A to 11D are connected in series to one another through contacts 144 and wiring lines 145, and a first end of a series connection of the resistive layers 142 (an upper end of the leftmost trigger element 11A) is connected to the power supply terminal T1 (not illustrated), and a second end of the series connection of the resistive layers 142 (an upper end of the rightmost trigger element 11D) is connected to an input terminal of the inverter 12 (not illustrated).

The insulating layer 130 is formed on the semiconductor substrate 100P, the semiconductor layers 102N, 112N, and 122N, the conductive layer 132, and the block layer 143 so as to cover them. The insulating layer 130 may be made of, for example, an insulating material such as silicon oxide. An opening section is formed in a portion corresponding to the semiconductor layer 102N (drain) of the insulating layer 130, and a contact 103 for connection of a wiring line 104 to the semiconductor layer 102N is formed in the opening section. The wiring lines 104 (drain wiring lines) of the transistor elements 23A to 23D are connected to one another, and are connected to the power supply terminal T1 (not illustrated). Moreover, an opening section is formed in a portion corresponding to the semiconductor layer 112N (source) of the insulating layer 130, and a contact 113 for connection of a wiring line 114 to the semiconductor layer 112N is formed in the opening section. The wiring lines 114 (source wiring lines) of the transistor elements 23A to 23D are connected to one another, and are connected to the ground terminal T2 (not illustrated).

As a manufacturing procedure, first, the device isolation section 99 is formed in the semiconductor substrate 100P. Then, the insulating layers 131 and 141 are simultaneously formed on the semiconductor substrate 100P by a same process, and after that, the conductive layer 132 (gate) and the resistive layer 142 are simultaneously formed by a same process. It is to be noted that the conductive layer 132 is not silicided at this point. Then, the semiconductor layers 102N (drain), 112N, and 122N (source) are simultaneously formed in the surface of the semiconductor substrate 100P, and the semiconductor layer 129P are formed in the surface of the semiconductor substrate 100P. Next, the block layer 143 is formed on the resistive layer 142, and after that, the conductive layer 132 is selectively silicided by a siliciding process. Then, the insulating layer 130 is formed so as to cover the semiconductor substrate 100P, the semiconductor layers 102N, 112N, and 122N, the conductive layer 132, the block layer 143, and the like. After that, contact holes are formed in the insulating layer 130, and the contacts 103 and 113, the wiring lines 104 and 114, and the like are formed.

Thus, in the protection circuit 1, the semiconductor layer 122N is provided between the semiconductor layer 102N (drain) and the semiconductor layer 112N (source). Therefore, as will be described later, the transistor 13 easily causes a snapback operation, and is allowed to enhance tolerance to static electricity.

Moreover, in the protection circuit 1, the insulating layer 141, the resistive layer 142, and the like are laminated on the semiconductor substrate 100P in the region between the semiconductor layer 102N (drain) and the semiconductor layer 122N to form the trigger device 10 (the trigger elements 11A to 11D). Thus, the time constant $\tau$ of the trigger device 10 is achievable with use of the resistive component of the resistive layer 142 and the capacitive component of the insulating layer 141, and the trigger device 10 is allowed to be formed in a region of the transistor 13; therefore, a layout area of the protection circuit 1 is allowed to be reduced.

In this description, the power supply terminal T1 corresponds to a specific example of "first terminal" in an embodiment of the present disclosure, and the ground terminal T2 corresponds to a specific example of "second terminal" in an embodiment of the present disclosure. The insulating layer 141 corresponds to a specific example of "first insulating layer" in an embodiment of the present disclosure. The semiconductor substrate 100P corresponds to a specific example of "first semiconductor layer" in an embodiment of the present disclosure. The semiconductor layer 102N corresponds to a specific example of "second semiconductor layer" in an embodiment of the present disclosure. The semiconductor layer 112N corresponds to a specific example of "third semiconductor layer" in an embodiment of the present disclosure. The semiconductor layer 122N corresponds to a specific example of "fourth semiconductor layer" in an embodiment of the present disclosure. The insulating layer 131 corresponds to a specific example of "second insulating layer" in an embodiment of the present disclosure.

[Operation and Function]

Next, operation and function of the protection circuit 1 according to this embodiment will be described below.

(Summary of Entire Operation)

First, summary of the entire operation of the protection circuit 1 will be described below referring to FIG. 1. The trigger device 10 generates the trigger signal St by rounding the waveform of the voltage signal of the power supply terminal T1 by the time constant $\tau$. The inverter 12 inverts the logic of the trigger signal St. The transistor 13 turns on or off, based on the logic-inverted trigger signal St. Thus, in the protection circuit 1, at normal power-on, the transistor 13 operates so as to maintain the OFF state, and on the other hand, in a case where static electricity is applied to the power supply terminal T1, the transistor 13 is transiently turned to the ON state, and operates so as to discharge the static electricity from the power supply to the ground.

(About Tolerance to Static Electricity)

In the protection circuit 1, in a case where static electricity is applied to the power supply terminal T1, a gate voltage of the transistor 13 is transiently turned to a high level to turn the transistor 13 to the ON state, thereby discharging the static electricity from the power supply to the ground. At this time, the transistor 13 easily discharges static electricity from the power supply to the ground by performing a so-called snapback operation that will be described below.

Figure 4:
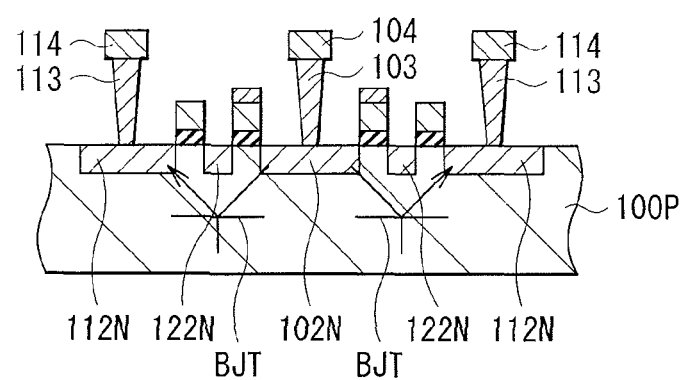
FIG. 4 is an explanatory diagram for describing a snapback operation of the transistor illustrated in FIG. 1.

FIG. 4 schematically illustrates the snapback operation. When the gate voltage of the transistor 13 is turned to the high level, and the transistor is turned to the ON state, a current flows from the semiconductor layer 102N (drain) to the semiconductor layer 112N (source). At this time, since static electricity is applied to the power supply terminal T1, a voltage extremely higher than that in a normal operation state is generated in the semiconductor layer 102N (drain). In such a case, a current flows from the semiconductor layer 102N (drain) to the semiconductor substrate 100P to cause an increase in a potential of the semiconductor substrate 100P. Then, when the potential of the semiconductor substrate 100P reaches a certain voltage, as illustrated in FIG. 4, the semiconductor layer 102N, the semiconductor substrate 100P, and the semiconductor layer 112N form an NPN parasitic bipolar transistor BJT, and more current flows from the semiconductor layer 102N to the semiconductor layer 112N through the semiconductor substrate 100P. In other words, the transistor 13 allows more current than a drain current of a MOS transistor in a typical operation state to flow by the snapback operation, and is allowed to efficiently discharge static electricity from the power supply to the ground. Thus, in the protection circuit 1, tolerance to static electricity is allowed to be enhanced by performing the snapback operation in the transistor 13.

Moreover, in the transistor 13, the semiconductor layer 122N is provided between the semiconductor layer 102N (drain) and the semiconductor layer 112N (source). In other words, the semiconductor layer 102N (drain) and the semiconductor layer 122N are formed separately from each other, and the semiconductor substrate 100P with higher resistivity than that of the semiconductor layers 102N and 122N is sandwiched between the semiconductor layers 102N and 122N. Thus, a resistive component between the source and the drain during the snapback operation is allowed to be reduced, a current is allowed to flow more easily, and static electricity is allowed to be discharged more efficiently from the power supply to the ground.

Further, as will be described below, concentration of current is preventable in a portion of the semiconductor substrate 100P sandwiched between the semiconductor layers 102N and 122N, and tolerance to static electricity is allowed to be enhanced.

Figure 5:
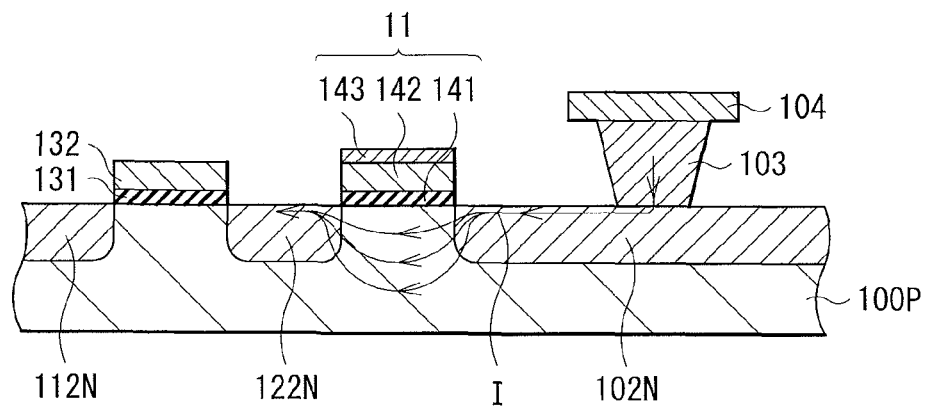
FIG. 5 is an explanatory diagram for describing a current flow in the transistor illustrated in FIG. 1.

FIG. 5 schematically illustrates a current flow when the transistor 13 is turned to the ON state. As illustrated in FIG. 5, a current I having flown from the wiring line 104 to the semiconductor layer 102N (drain) flows near a surface of the semiconductor layer 102N. Then, when the current I flows to the semiconductor substrate 100P near a bottom of the trigger element 11, the current I dispersedly flows to reduce current density. After that, the current I flows from the semiconductor substrate 100P to the semiconductor layer 122N. In the semiconductor layer 122N, the current I flows near a surface of the semiconductor layer 122N. Thus, in the transistor 13, the current I dispersedly flows through the semiconductor substrate 100P between the semiconductor layer 102N (drain) and the semiconductor layer 122N, and the current density in this region is allowed to be reduced accordingly; therefore, tolerance to static electricity is allowed to be enhanced.
(About Area)

In the protection circuit 1, the trigger device 10 (the trigger elements 11A to 11D) is formed in a region where the transistor 13 is formed. Therefore, as will be described below, the area of the protection circuit 1 is allowed to be reduced.

Figure 6:
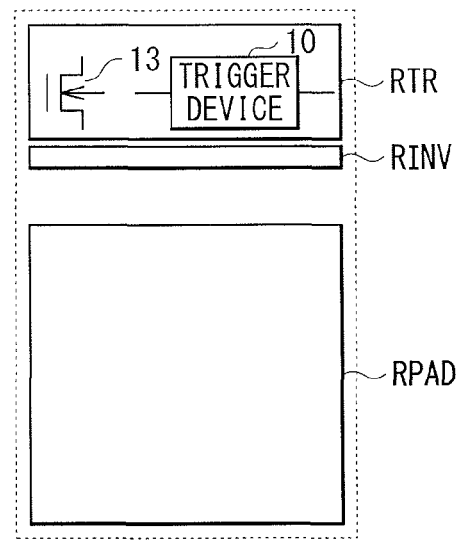
FIG. 6 is an explanatory diagram schematically illustrating a layout of the protection circuit illustrated in FIG. 1.

FIG. 6 illustrates a layout of the protection circuit 1. The protection circuit 1 may be disposed, for example, near a pad (a pad region RPAD) for the power supply terminal T1. An inverter region RINV is a region where the inverter 12 is disposed. A transistor region RTR is a region where the transistor 13 and the trigger device 10 are disposed. In the protection circuit 1, the trigger device 10 is disposed together with the transistor 13 in the transistor region RTR; therefore, compared to a protection circuit 1R according to a comparative example that will be described later, the area of the protection circuit 1 is allowed to be reduced.
(About Manufacturing Processes)

Moreover, in the protection circuit 1, the resistive layer 142 is formed of the same material (for example, polysilicon) as that of the conductive layer 132 (gate), and the block layer 143 is formed on the resistive layer 142 to block the resistive layer 142 from being silicided; therefore, the manufacturing procedure is allowed to be simplified. In other words, the number of manufacturing processes is increased in a case where the resistive layer 142 is formed by a manufacturing process different from a process of manufacturing the conductive layer 132; therefore, the manufacturing procedure may be complicated. On the other hand, in the protection circuit 1, the resistive layer 142 is formed by the same manufacturing process as that of the conductive layer 132 (gate), and after that, only the conductive layer 132 is selectively silicided. Thus, the resistive layer 142 with high resistivity and the conductive layer with low resistivity are allowed to be formed by a simple manufacturing procedure.

Comparative Example

Next, compared to the protection circuit 1R according to the comparative example, effects of the protection circuit 1 according to this embodiment will be described below. This comparative example differs from this embodiment in a circuit configuration that generates the trigger signal St. Other configurations are similar to those in this embodiment (refer to FIG. 1 and the like).

Figure 7:
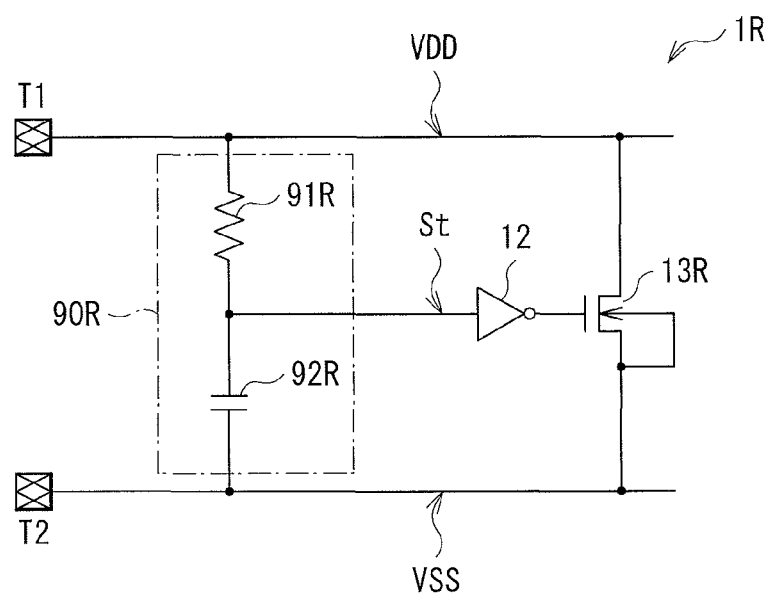
FIG. 7 is a block diagram illustrating a configuration example of a protection circuit according to a comparative example.
Figure 8:
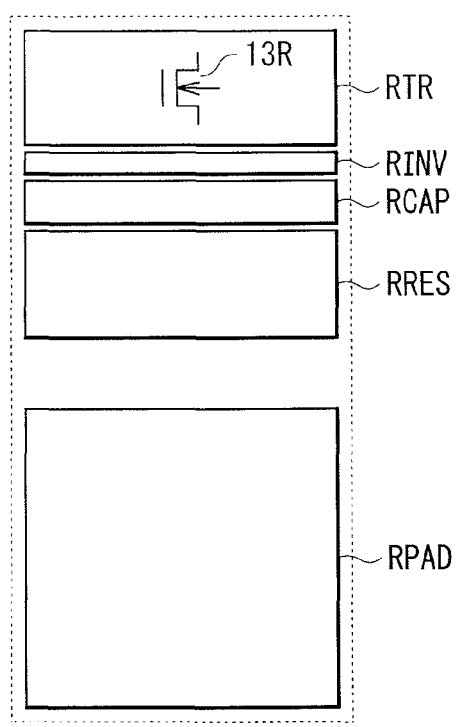
FIG. 8 is an explanatory diagram schematically illustrating a layout of the protection circuit illustrated in FIG. 7.

FIG. 7 illustrates a configuration example of the protection circuit 1R according to the comparative example. FIG. 8 illustrates a layout of the protection circuit 1R. The protection circuit 1R includes a trigger circuit 90R and a transistor 13R. The trigger circuit 90R is configured to generate the trigger signal St, based on a voltage signal in the power supply terminal T1, and includes a resistor device 91R and a capacitor device 92R. A first end of the resistor device 91R is connected to the power supply terminal T1, and a second end of the resistor device 91R is connected to a first end of the capacitor device 92R and the input terminal of the inverter 12. The first end of the capacitor device 92R is connected to the second end of the resistor device 91R and the input terminal of the inverter 12, and a second end of the capacitor device 92R is connected to the ground terminal T2. This configuration allows the trigger circuit 90R to function as a low-pass filter with the time constant τ. In other words, the trigger circuit 90R is a lumped constant circuit, and the time constant τ of the trigger circuit 90R is determined by a resistance value of the resistor device 91R and a capacity value of the capacitor device 92R. The resistor device 91R is disposed in a resistor device region RRES, and the capacitor device 92R is disposed in a capacitor device region RCAP.

Figure 9:
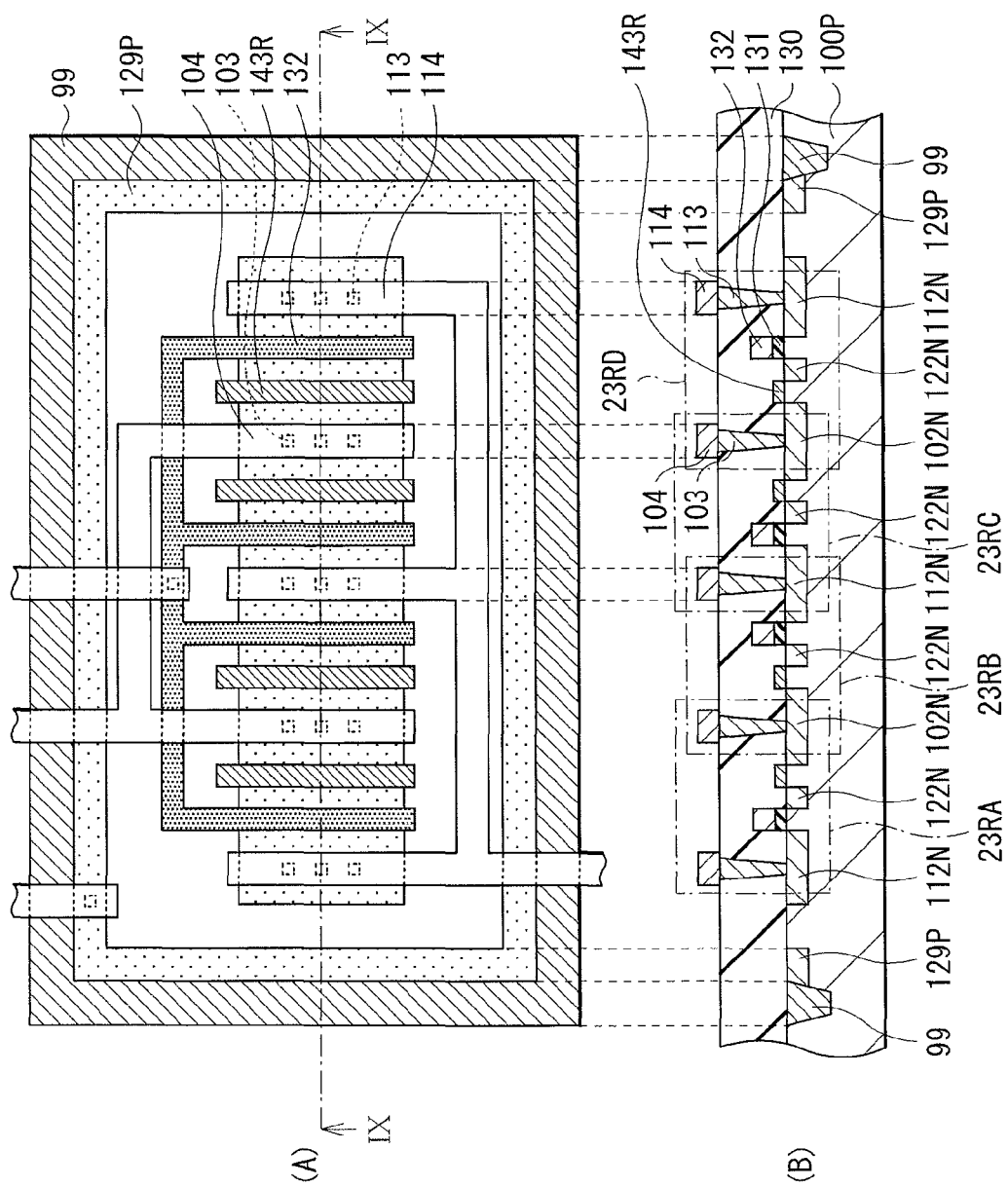
FIG. 9 is a plan view and a sectional view illustrating a layout of the transistor illustrated in FIG. 7.

FIG. 9 illustrates an example of a layout of the transistor 13R, parts (A) and (B) in FIG. 9 illustrate a plan view and a sectional view taken along a line IX-IX in an arrow direction, respectively. Also in this example, the transistor 13R is divided into transistor elements 23RA to 23RD. The transistor 13R includes the semiconductor layer 122N between the semiconductor layer 102N (drain) and the semiconductor layer 112N (source). A block layer 143R is formed on the semiconductor substrate 100P in a region between the semiconductor layer 102N (drain) and the semiconductor layer 122N. In other words, in the protection circuit 1 according to this embodiment, the trigger element 11 configured of the insulating layer 141, the resistive layer 142, and the block layer 143 is formed in this region, but on the other hand, in the protection circuit 1R according to the comparative example, only the block layer 143R is formed in this region. The block layer 143R is configured to form the semiconductor layer 102R and the semiconductor layer 122R separately from each other in a manufacturing process.

In the protection circuit 1R according to the comparative example, tolerance to static electricity is allowed to be enhanced in exactly the same manner as the protection circuit 1 according to this embodiment. However, in the protection circuit 1R according to the comparative example, the resistor device 91R and the capacitor device 92R are configured as separate bodies, and, as illustrated in FIG. 8, the resistor device 91R and the capacitor device 92R are formed in respective dedicated regions (the resistor device region RRES and the capacitor device region RCAP, respectively) different from the transistor region RTR. Therefore, a layout area of the entire protection circuit 1R may be increased. In particular, in a case where design is made to satisfy HBM ESD testing standards, it is necessary to set the time constant τ to a large value, and the resistance value of the resistor device 91R and the capacity value of the capacitor device 92R become large (for example, 500 [kΩ] and 5 [pF], respectively) accordingly. In this case, the areas of the resistor device region RRES and the capacitor device region RCAP may be increased to cause an increase in the layout area of the entire protection circuit 1R.

On the other hand, in the protection circuit 1 according to this embodiment, the trigger device 10 (the trigger elements 11A to 11D) is configured by laminating the insulating layer 141, the resistive layer 142, and the like on the semiconductor substrate 100P in the transistor region RTR. In other words, in the protection circuit 1, the trigger device 10 is configured as a single body of a distributed parameter circuit configured of the resistive component of the resistive layer 142 and the capacitive component of the insulating layer 141; therefore, compared to the case where the resistor device 91R and the capacitor device 92R in the comparative example are configured as separate bodies, a compact configuration is achievable. Moreover, in the protection circuit 1, the trigger device 10 is formed in the transistor region RTR, and a region dedicated to the trigger device 10 is not necessary. Therefore, the layout area (refer to FIG. 6) of the entire protection circuit 1 is allowed to be smaller than the layout area (refer to FIG. 8) of the entire protection circuit 1R according to the comparative example. In other words, in the protection circuit 1R according to the comparative example, to enhance tolerance to static electricity, the block layer 143R is provided to form the semiconductor layer 102N and the semiconductor layer 122N separately from each other; however, in the protection circuit 1 according to this embodiment, the trigger device 10 is formed in a space where the block layer 143 is formed to effectively use the space. Thus, in the protection circuit 1, the layout area is allowed to be reduced.

[Effects]

Thus, in this embodiment, the trigger device is formed in the transistor region; therefore, the layout area of the protection circuit is allowed to be reduced.

Moreover, in this embodiment, the trigger device is configured as a single body of a distributed parameter circuit configured of the resistive component of the resistive layer and the capacitive component of the insulating layer; therefore, the trigger device is allowed to have a compact configuration, and the layout area of the protection circuit is allowed to be reduced.

Further, in this embodiment, the resistive layer is formed of the same material as that of the conductive layer (gate), and the block layer is formed on the resistive layer to block the resistive layer from being silicided; therefore, the manufacturing procedure is allowed to be simplified.

Modification Example 1

In the above-described embodiment, the transistor 13 is divided into four transistor elements 23A to 23D; however, the number of transistor elements is not limited to four, and the transistor 13 may be divided into, for example, three or less or five or more transistor elements 23, or the transistor 13 may not be divided into a plurality of transistor elements.

Moreover, in the above-described embodiment, the trigger device 10 is configured of four trigger elements 11A to 11D; however, the number of trigger elements is not limited to four, and the trigger device 10 may be configured of three or less or five or more trigger elements.

Modification Example 2

Figure 10:
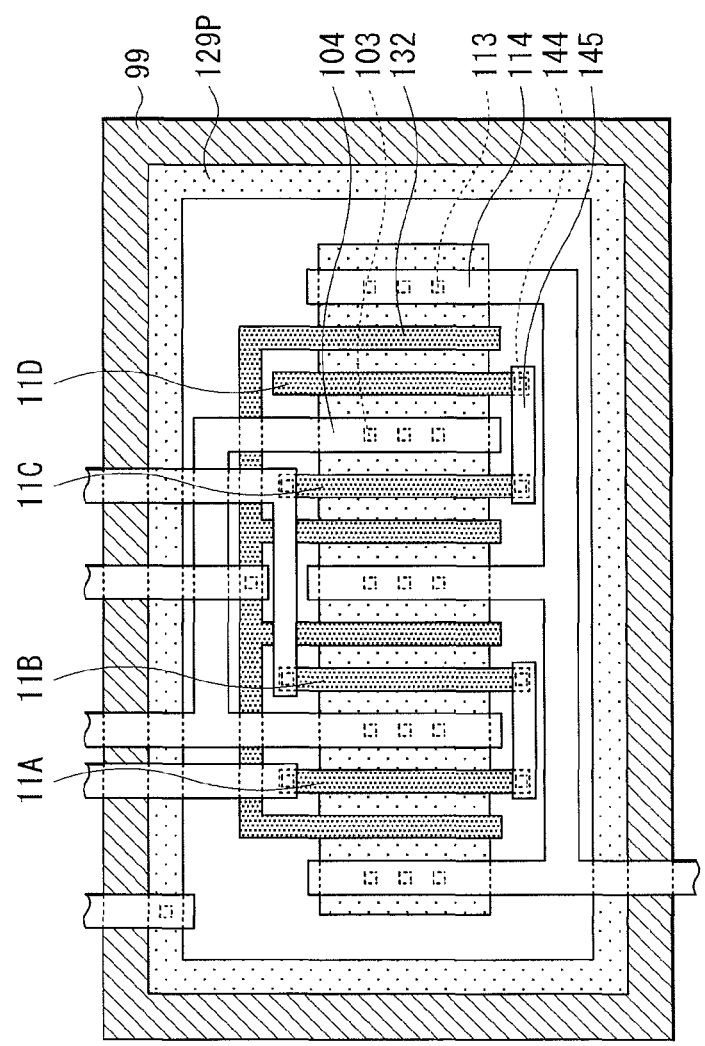
FIG. 10 is a plan view illustrating a layout of a transistor and a trigger device in a protection circuit according to a modification example.

In the above-described embodiment, an equal number of the trigger elements 11 to the number of transistor elements 23 are provided, and the trigger elements 11 are connected in series to one another; however, the embodiment is not limited thereto, and a smaller number of trigger element 11 than the number of the transistor elements 23 may be connected in series to one another. In an example illustrated in FIG. 10, two trigger elements 11A and 11B on the left are connected in series to each other, and a first end of a series connection of the trigger elements 11A and 11B (an upper end of the leftmost trigger element 11A) is connected to the power supply terminal T1, and a second end of the series connection of the trigger elements 11A and 11B (an upper end of the second trigger element 11B from the left) is connected to the input terminal of the inverter 12. Moreover, in this example, an upper end of the third trigger element 11C from the left is connected to an upper end of the second trigger element 11B from the left, and a lower end of the third trigger element 11C from the left is connected to a lower end of the fourth trigger element 11D from the left, thereby using these two trigger elements 11C and 11D as capacitor devices.

Modification Example 3

Figure 11:
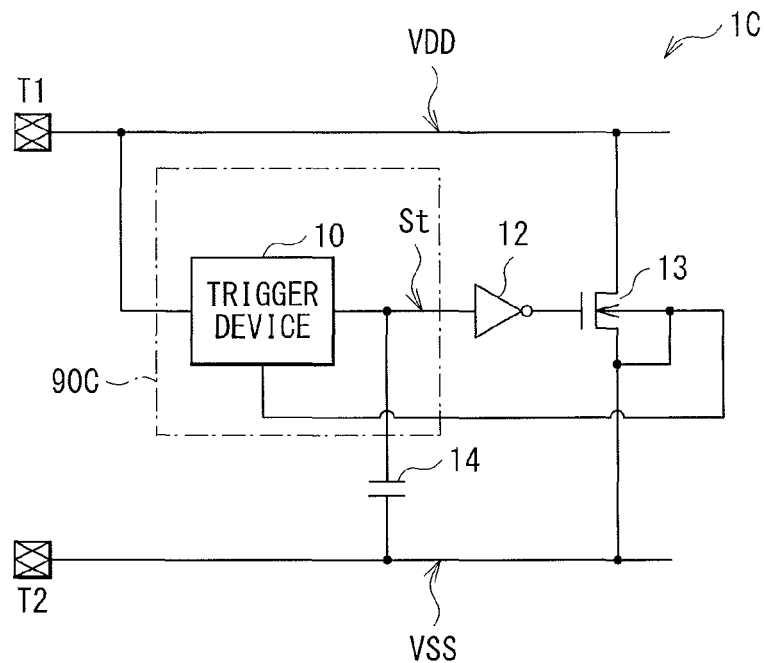
FIG. 11 is a block diagram illustrating a configuration example of a protection circuit according to another modification example.

In the above-described embodiment, the trigger device 10 generates the trigger signal St; however, the embodiment is not limited thereto, and, for example, a trigger circuit configured by adding another element to the trigger device 10 may generate the trigger signal St. More specifically, for example, like a protection circuit 1C illustrated in FIG. 11, a trigger circuit 90C may be configured with use of the trigger device 10 and a capacitor device 14 disposed between the input terminal of the inverter 12 and the ground terminal T2. Moreover, for example, although not illustrated, a trigger circuit may be configured by further connecting a resistor device in series to the trigger device 10.

Modification Example 4

Figure 12:
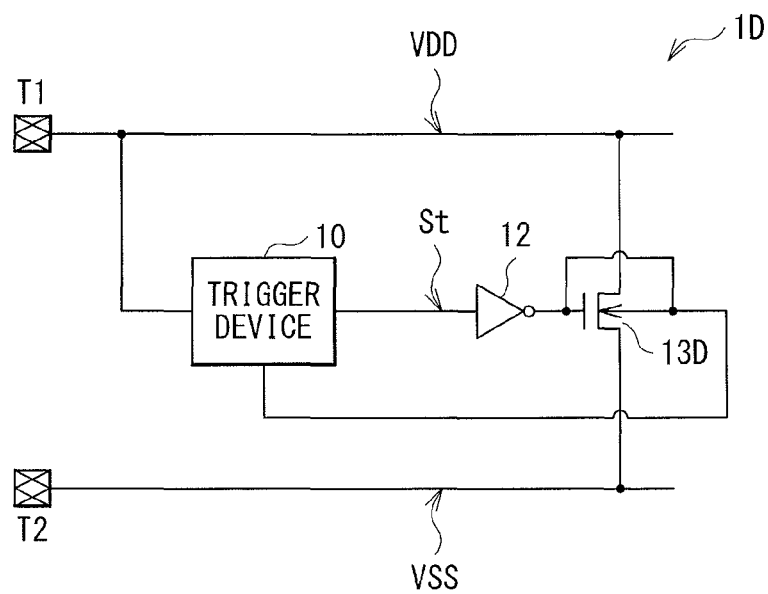
FIG. 12 is a block diagram illustrating a configuration example of a protection circuit according to still another modification example.

In the above-described embodiment, the voltage VSS is applied to a back gate of the transistor 13; however, the embodiment is not limited thereto. Alternatively, for example, like a protection circuit 1D illustrated in FIG. 12, an output voltage of the inverter 12 may be applied to a back gate of a transistor 13D. Accordingly, the voltage of the back gate during the snapback operation in the transistor 13D is allowed to be further increased; therefore, a resistive component between the drain and the source is allowed to be reduced, and a current is allowed to flow more easily. It is to be noted that, in this case, it is desirable to provide a P-type well as the back gate of the transistor 13, and to provide, between the P-type well and the semiconductor substrate 100P, an N well, to which the voltage VDD is applied, for electrical isolation between the P-type well and the semiconductor substrate 100.

2. Application Examples

Next, application examples of the protection circuits described in the above embodiment and the above modification examples will be described below.

Figure 13:
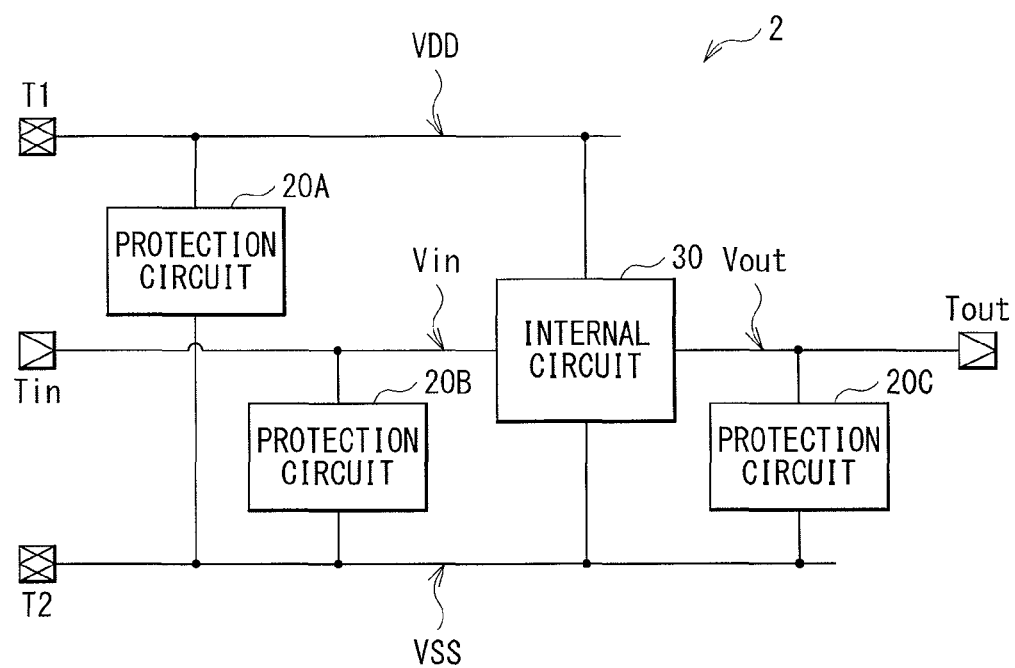
FIG. 13 is a block diagram illustrating a configuration example of a semiconductor unit to which the protection circuit according to the embodiment is applied.

FIG. 13 illustrates a configuration example of a semiconductor unit 1 to which any of the protection circuits according to the above-described embodiment and the like is applied. The semiconductor unit 2 includes an internal circuit 30 and protection circuits 20A, 20B, and 20C. The voltage VDD is supplied to the internal circuit 30 through the power supply terminal T1, and the voltage VSS is supplied to the internal circuit 30 through the ground terminal T2. Then, the internal circuit 30 performs processing, based on an input voltage Vin supplied through an input terminal Tin, and outputs a result of the processing as an output voltage Vout to an output terminal Tout. The protection circuit 20A is disposed between the power supply terminal T1 and the ground terminal T2, the protection circuit 20B is disposed between the input terminal Tin and the ground terminal T2, and the protection circuit 20C is disposed between the output terminal Tout and the ground terminal T3. Each of the protection circuits 20A to 20C is configured of any of the protection circuits according to the above-described embodiment and the like. In other words, the protection circuits according to the above-described embodiment and the like are applicable to not only the power supply terminal T1 but also various terminals including the input terminal Tin and the output terminal Tout.

Figure 14:
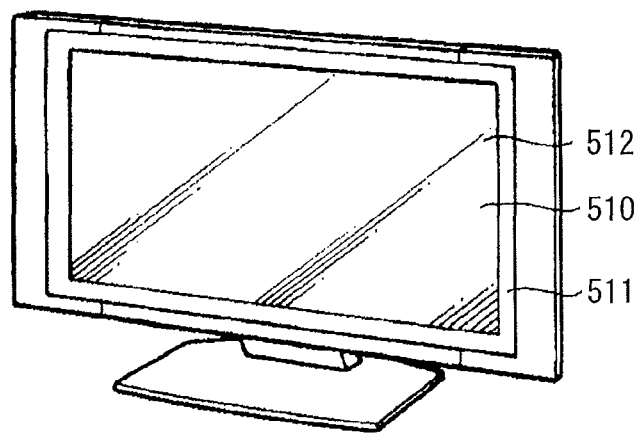
FIG. 14 is a perspective view illustrating an appearance configuration of a television to which the protection circuit according to the embodiment is applied.

FIG. 14 illustrates an appearance of a television to which any of the protection circuits according to the above-described embodiment and the like is applied. The television may include an image display screen section 510 including a front panel 511 and a filter glass 512. The television contains a semiconductor unit including any of the protection circuits according to the above-described embodiment and the like.

The protection circuits according to the above-described embodiment and the like are applicable to, in addition to such a television, electronic apparatuses in any fields, including digital cameras, notebook personal computers, portable terminal devices such as cellular phones, portable game machines, and video cameras. In other words, the protection circuits according to the above-described embodiment and the like are applicable to electronic apparatuses in any fields.

Although the technology of the present disclosure is described referring to the embodiment, the modification examples, and the application examples to electronic apparatuses, the technology is not limited thereto, and may be variously modified.

For example, in the above-described embodiment and the like, the transistor 13 is configured of an N-type MOS transistor; however, the transistor 13 is not limited thereto. Alternatively, the transistor 13 may be configured of, for example, a P-type MOS transistor. In this case, instead of the inverter 12, a buffer circuit configured to output an input logic level without performing logic inversion, or the like may be preferably provided.

Moreover, for example, in the above-described embodiment and the like, the resistive layer 142 is formed of the same material (for example, polysilicon) as that of the conductive layer 132; however, the material of the resistive layer 142 is not limited thereto. Alternatively, the resistive layer 142 may be formed of a material different from that of the conductive layer 132. Even in this case, the layout area of the protection circuit is allowed to be reduced.

It is to be noted that the technology of the present disclosure may have the following configurations.

(1) A semiconductor unit including:
a transistor configured to provide electrical conduction between a first terminal and a second terminal, based on a trigger signal; and
a trigger device formed in a transistor region where the transistor is formed, and configured to generate the trigger signal, based on a voltage applied to the first terminal.

(2) The semiconductor unit according to (1), in which the trigger device includes a first insulating layer and a resistive layer, the first insulating layer provided on a surface of a part of the transistor region, the resistive layer provided on the first insulating layer.

(3) The semiconductor unit according to (2), in which the trigger device includes a block layer formed on the resistive layer.

(4) The semiconductor unit according to (2) or (3), in which
the transistor includes
a first semiconductor layer of a first conductive type,
a second semiconductor layer of a second conductive type, the second semiconductor layer connected to the first terminal and selectively provided in the first semiconductor layer close to a surface of the first semiconductor layer,
a third semiconductor layer of the second conductive type, the third semiconductor layer connected to the second terminal and selectively provided in the first semiconductor layer close to the surface of the first semiconductor layer at a distance from the second semiconductor layer,
a fourth semiconductor layer of the second conductive type, the fourth semiconductor layer provided between the second semiconductor layer and the third semiconductor layer in the first semiconductor layer close to the surface of the first semiconductor layer,
a second insulating layer provided on the surface of the first semiconductor layer between the third semiconductor layer and the fourth semiconductor layer, and
a conductive layer provided on the second insulating layer, the conductive layer to which a signal corresponding to the trigger signal is supplied.

(5) The semiconductor unit according to (4), in which the trigger device is provided on the surface of the first semiconductor layer between the second semiconductor layer and the third semiconductor layer.

(6) The semiconductor unit according to (5), in which the trigger device extends in a direction intersecting with a direction where the second semiconductor layer, the third semiconductor layer, and the fourth semiconductor layer are arranged to lead a first end and a second end of the trigger device to the first terminal and the conductive layer, respectively.

(7) The semiconductor unit according to (6), further including an inverter including an input terminal and an output terminal, the input terminal led to the second end of the trigger device, the output terminal connected to the conductive layer,
in which the first conductive type is a P type, and the second conductive type is an N type.

(8) The semiconductor unit according to any one of (4) to (7), in which
the resistive layer is a polysilicon layer, and the conductive layer is a silicided polysilicon layer.

(9) The semiconductor unit according to any one of (1) to (8), in which the trigger device is a distributed parameter device including a resistive component of the resistive layer and a capacitive component of the first insulating layer.

(10) The semiconductor unit according to any one of (1) to (9), in which
the transistor is configured of a predetermined number of transistor elements, and
the trigger device is configured of the predetermined number of trigger elements.

(11) An electronic apparatus including:
a transistor configured to provide electrical conduction between a first terminal and a second terminal, based on a trigger signal;
a trigger device formed in a transistor region where the transistor is formed, and configured to generate the trigger signal, based on a voltage applied to the first terminal; and
an internal circuit connected to the first terminal and the second terminal.

It should be understood by those skilled in the art that various modifications, combinations, sub-combinations, and alterations may occur depending on design requirements and other factors insofar as they are within the scope of the appended claims or the equivalents thereof.

What is claimed is:
1. A semiconductor unit comprising:
a substrate of a first conductive type;
a transistor configured to provide electrical conduction between a first terminal and a second terminal based on a trigger signal, the transistor including a source region, a gate region, and a drain region in the substrate that are arranged in series along a first direction within a transistor region of the substrate;
a trigger device configured to generate the trigger signal based on a voltage applied to the first terminal, the trigger device positioned in series between the gate region and the drain region and including a resistive layer on a part of the substrate that is between the gate region and the drain region along the first direction; and
a semiconductor region of a second conductive type opposite the first conductive type between the gate region and the part of the substrate of the first conductive type on which the resistive layer is positioned,
wherein,
the source region, the semiconductor region, and a region of the substrate underlying the trigger device form a parasitic bipolar transistor when the trigger device generates the trigger signal.

2. The semiconductor unit according to claim 1, wherein:
the trigger device includes a first insulating layer and the resistive layer,
the first insulating layer is on a surface of the transistor region, and
the resistive layer is on the first insulating layer.

3. The semiconductor unit according to claim 2, wherein:
(1) the transistor includes
a first semiconductor layer of a first conductive type,
a second semiconductor layer of a second conductive type, the second semiconductor layer connected to the first terminal and provided in the first semiconductor layer and at a surface of the first semiconductor layer,
a third semiconductor layer of the second conductive type, the third semiconductor layer connected to the second terminal and provided in the first semiconductor layer and at the surface of the first semiconductor layer at a distance from the second semiconductor layer,
a fourth semiconductor layer of the second conductive type, the fourth semiconductor layer being between the second semiconductor layer and the third semiconductor layer, the fourth semiconductor layer being in the first semiconductor layer and at the surface of the first semiconductor layer,
a second insulating layer on the surface of the first semiconductor layer and between the third semiconductor layer and the fourth semiconductor layer, and
a conductive layer on the second insulating layer, the conductive layer to which a signal corresponding to the trigger signal is supplied;
(2) the substrate comprises the first semiconductor layer; and
(3) the transistor is configured such that (a) the drain region comprises the second semiconductor layer, (b) the source region comprises the third semiconductor layer, (c) the semiconductor region comprises the fourth semiconductor layer, and (d) the conductive layer overlies the gate region and serves as a gate electrode.

4. The semiconductor unit according to claim 3, wherein the trigger device is on the surface of the first semiconductor layer.

5. The semiconductor unit according to claim 4, wherein:
the second semiconductor layer, the third semiconductor layer, and the fourth semiconductor layer are arranged along the first direction, and
the trigger device extends along a second direction such that a first end of the trigger device is connected to the first terminal and a second end of the trigger device is connected to the conductive layer.

6. The semiconductor unit according to claim 5, further comprising an inverter including an input terminal and an output terminal, the input terminal being connected to the second end of the trigger device, the output terminal being connected to the conductive layer,
wherein,
the first conductive type is a P-type, and
the second conductive type is an N-type.

7. The semiconductor unit according to claim 3, wherein:
the resistive layer is a polysilicon layer, and
the conductive layer is a silicided polysilicon layer.

8. The semiconductor unit according to claim 1, wherein the trigger device includes a block layer on the resistive layer, the blocking layer preventing siliciding of the resistive layer.

9. The semiconductor unit according to claim 1, wherein the trigger device includes the resistive layer and a first insulating layer.

10. The semiconductor unit according to claim 1, wherein:
the transistor comprises a predetermined number of transistor elements, and
the trigger device comprises the predetermined number of trigger elements.

11. The semiconductor device of claim 1, further comprising an inverter with an input terminal and an output terminal, wherein:
the first and second terminals are power terminals,
a first end of the resistance layer is connected to the first terminal,
a second end of the resistance layer is connected to the input terminal of the inverter, and
the output terminal of the inverter is connected to the gate of the transistor.

12. An electronic apparatus comprising:
a substrate of a first conductivity type;
a transistor configured to provide electrical conduction between a first terminal and a second terminal based on a trigger signal, the transistor including a source region, a gate region, and a drain region in the substrate that are arranged in series along a first direction within a transistor region of the substrate;
a trigger device configured to generate the trigger signal based on a voltage applied to the first terminal, the trigger device positioned in series between the gate region and the drain region and including a resistive layer on a part of the substrate that is between the gate region and the drain region along the first direction;
a semiconductor region of a second conductive type opposite the first conductive type between the gate region and the part of the substrate of the first conductive type on which the resistive layer is positioned; and
an internal circuit connected to the first terminal and the second terminal,
wherein,
the source region, the semiconductor region, and a region of the substrate underlying the trigger device form a parasitic bipolar transistor when the trigger device generates the trigger signal.

13. The electronic apparatus according to claim 12, wherein:
the trigger device includes a first insulating layer and the resistive layer,
the first insulating layer is on a surface of the transistor region, and
the resistive layer is on the first insulating layer.

14. The electronic apparatus according to claim 12, wherein the trigger device includes a block layer on the resistive layer.

15. The electronic apparatus according to claim 12, wherein:
(1) the transistor includes
a first semiconductor layer of a first conductive type,
a second semiconductor layer of a second conductive type, the second semiconductor layer connected to the first terminal and provided in the first semiconductor layer and at a surface of the first semiconductor layer,
a third semiconductor layer of the second conductive type, the third semiconductor layer connected to the second terminal and provided in the first semiconductor layer and at the surface of the first semiconductor layer at a distance from the second semiconductor layer,
a fourth semiconductor layer of the second conductive type, the fourth semiconductor layer being between the second semiconductor layer and the third semiconductor layer, the fourth semiconductor layer being in the first semiconductor layer and at the surface of the first semiconductor layer,
a second insulating layer on the surface of the first semiconductor layer between the third semiconductor layer and the fourth semiconductor layer, and
a conductive layer on the second insulating layer, the conductive layer to which a signal corresponding to the trigger signal is applied;
(2) the substrate comprises the first semiconductor layer; and
(3) the transistor is configured such that (a) the drain region comprises the second semiconductor layer, (b) the source region comprises the third semiconductor layer, (c) the semiconductor region comprises the fourth semiconductor layer, and (d) the conductive layer overlies the gate region and serves as a gate electrode.

16. A semiconductor device comprising:
a substrate of a first conductivity type;
a transistor comprised of (a) a source region and drain region in the substrate, both of which are of a second conductivity type opposite the first conductivity type, (b) a gate region in series between the source and the drain, (c) a gate electrode overlying the gate region, and (d) a first insulating layer between the gate electrode and the substrate; and
a trigger device comprised of a semiconductor region of the second conductivity type in the substrate, a resistive layer on the substrate, a second insulating layer between the resistive layer and the substrate, and a blocking layer on the resistive layer,
wherein,
the semiconductor region is in series between the gate region and the drain region and is spaced apart from both the source region and the drain region thereby leaving a trigger device region of the first conductivity type in series between the semiconductor region and the drain region,
the trigger device resistive layer overlies the trigger device region,
the source region, the semiconductor region, and a region of the substrate underlying the trigger device form a parasitic bipolar transistor when the trigger device generates the trigger signal, and
the trigger device blocking layer is resistive to siliciding.

17. The semiconductor device of claim 16 comprising a plurality of the trigger devices connected in series, and a plurality of the transistors the drain regions of which are connected in common and the source regions of which are connected in common.

* * * * *